United States Patent
Sherstinsky et al.

[11] Patent Number: 5,883,778
[45] Date of Patent: *Mar. 16, 1999

[54] ELECTROSTATIC CHUCK WITH FLUID FLOW REGULATOR

[75] Inventors: Semyon Sherstinsky, San Francisco; John F. Cameron, Los Altos; Shamouil Shamouilian, San Jose; Manoocher Birang, Los Gatos; Alfred Mak, Union City; Simon W. Tam, Milpitas; Robert E. Ryan, Sunnyvale, all of Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 503,790

[22] Filed: Jul. 18, 1995

Related U.S. Application Data

[63] Continuation-in-part of Ser. No. 203,111, Feb. 28, 1994, abandoned.

[51] Int. Cl.$^6$ .................................................. H02N 13/00
[52] U.S. Cl. .......................................... 361/234; 279/128
[58] Field of Search .................................... 361/233, 234; 269/8, 903; 279/128

[56] References Cited

U.S. PATENT DOCUMENTS

| | | |
|---|---|---|
| H1145 | 3/1993 | Anderson . |
| 4,512,391 | 4/1985 | Harra . |
| 4,567,938 | 2/1986 | Turner . |
| 4,603,466 | 8/1986 | Morley . |
| 4,615,764 | 10/1986 | Bobbio et al. ........................... 156/643 |
| 4,628,991 | 12/1986 | Hsiao et al. . |
| 4,724,510 | 2/1988 | Wicker et al. ........................... 361/234 |
| 4,771,730 | 9/1988 | Tezuka ..................................... 118/723 |
| 4,807,016 | 2/1989 | Douglas ..................................... 357/67 |
| 4,909,314 | 3/1990 | Lamont, Jr. . |
| 5,055,964 | 10/1991 | Logan et al. ............................. 361/234 |
| 5,099,571 | 3/1992 | Logan et al. ............................... 29/825 |
| 5,115,858 | 5/1992 | Fitch et al. . |
| 5,155,652 | 10/1992 | Logan et al. ............................. 361/234 |

(List continued on next page.)

FOREIGN PATENT DOCUMENTS

| | | |
|---|---|---|
| 0320297A2 | 12/1988 | European Pat. Off. . |
| 6349938 | 12/1994 | Japan . |

OTHER PUBLICATIONS

Communication, European Search Report, dated Oct. 31, 1996.

*Primary Examiner*—Fritz Fleming
*Attorney, Agent, or Firm*—Janah & Associates

[57] ABSTRACT

An electrostatic chuck 20 of the present invention is capable of maintaining substantially uniform temperatures across a substrate 30. The chuck 20 comprises an electrostatic member 35 that includes (i) an insulator 45 covering an electrode 40, (ii) a substantially planar and conformal contact surface 50 capable of conforming to a substrate 30, and (iii) conduits 105 terminating at the contact surface 50 for providing heat transfer fluid to the contact surface 50. Application of a voltage to the electrode 40 of the electrostatic member 35 electrostatically holds the substrate 30 on the conformal contact surface 50 to define an outer periphery 110 having (1) leaking portions 115 where heat transfer fluid leaks out, and (2) sealed portions 130 where heat transfer fluid substantially does not leak out. A fluid flow regulator 135 is provided for flowing heat transfer fluid at different flow rates through the conduits 105 in the electrostatic member 35 to provide (i) first flow rates of heat transfer fluid through the conduits 105 adjacent to the sealed portions 130 of the outer periphery 110 of the electrostatic member 35, and (ii) second flow rates of heat transfer fluid through the conduits 105 adjacent to the leaking portions 115, the second flow rates being higher than the first flow rates, to maintain substantially uniform temperatures across the substrate 30 held on the chuck 20.

25 Claims, 6 Drawing Sheets

U.S. PATENT DOCUMENTS

| | | | |
|---|---|---|---|
| 5,181,556 | 1/1993 | Hughes . | |
| 5,203,401 | 4/1993 | Hamburgen et al. . | |
| 5,207,437 | 5/1993 | Barnes et al. . | |
| 5,213,349 | 5/1993 | Elliott | 279/128 |
| 5,230,741 | 7/1993 | van de Ven et al. . | |
| 5,252,132 | 10/1993 | Oda et al. . | |
| 5,252,850 | 10/1993 | Schempp . | |
| 5,255,153 | 10/1993 | Nozawa et al. | 361/234 |
| 5,270,266 | 12/1993 | Hirano et al. . | |
| 5,275,683 | 1/1994 | Arami et al. | 156/345 |
| 5,280,156 | 1/1994 | Niori et al. | 219/385 |
| 5,287,914 | 2/1994 | Hughes . | |
| 5,302,209 | 4/1994 | Maeda et al. . | |
| 5,303,938 | 4/1994 | Miller et al. . | |
| 5,312,509 | 5/1994 | Eschbach . | |
| 5,315,473 | 5/1994 | Collins et al. | 361/234 |
| 5,345,999 | 9/1994 | Hosokawa | 165/80.2 |
| 5,350,479 | 9/1994 | Collins et al. | 279/128 |
| 5,356,476 | 10/1994 | Foster et al. . | |
| 5,382,311 | 1/1995 | Ishikawa et al. | 156/345 |
| 5,384,682 | 1/1995 | Watanabe et al. | 361/234 |
| 5,423,936 | 6/1995 | Tomita et al. | 156/345 |
| 5,426,558 | 6/1995 | Sherman | 361/234 |
| 5,445,709 | 8/1995 | Kojima et al. | 156/345 |
| 5,452,510 | 9/1995 | Barnes et al. | 29/825 |
| 5,539,179 | 7/1996 | Nozawa et al. | 219/121.43 |
| 5,539,609 | 7/1996 | Collins et al. | 361/234 |
| 5,542,559 | 8/1996 | Kawakami et al. | 216/67 |
| 5,634,266 | 6/1997 | Sherstinsky et al. | 361/234 |
| 5,656,093 | 8/1997 | Burkhart et al. | 279/128 |
| 5,671,117 | 9/1997 | Sherstinsky et al. | 361/234 |

ELECTROSTATIC CHUCK WITH FLUID FLOW REGULATOR

CROSS-REFERENCE

This application is a continuation-in-part of U.S. patent application Ser. No. 08/203,111, entitled "Electrostatic Chuck," filed on Feb. 28, 1994 now abandoned; and is related to U.S. Pat. No. 5,634,266, patent application Ser. No. 08/449,135, filed on May 24, 1995, both of which are incorporated herein by reference.

BACKGROUND

The present invention is directed to an electrostatic chuck for holding, and maintaining substantially uniform temperatures across a substrate during processing of the substrate, and for increasing the life of the chuck in erosive process environments.

In semiconductor fabrication processes, electrostatic chucks are used to hold substrates for processing of the substrate. Electrostatic chucks are particularly useful in vacuum processing environments where there is insufficient differential pressure to hold the substrate using a vacuum chuck. A typical electrostatic chuck comprises an electrostatic member supported by a support adapted to be secured in a process chamber. The electrostatic member comprises an electrically insulated electrode. An electrical connector electrically connects the electrode to a voltage supply source in the process chamber. When the electrode is electrically biased with respect to the substrate held on the chuck, opposing electrostatic charge accumulates in the electrode and substrate, resulting in attractive electrostatic forces that hold the substrate to the chuck. Electrostatic chucks are generally described in, for example U.S. patent application Ser. Nos. 08/278,787 by Cameron, et al.; 08/276,735 by Shamouilian, et al.; and 08/189,562, by Shamouilian, et al.—all of which are incorporated herein by reference.

Conventional electrostatic chucks can also have temperature controlling systems to regulate the temperatures across the substrate held on the chuck. However, conventional temperature controlling systems often do not maintain uniform temperatures across the substrate, particularly at the perimeter or edge of the substrate. Excessively high temperatures at portions of the substrate can damage the integrated circuit chips formed on the substrate, and low temperatures can result in non-uniform processing of the substrate.

A typical conventional temperature controlling system functions by introducing a heat transfer fluid, such as helium, below the substrate via a single central aperture in the chuck. The single central aperture is often used to supply helium to recessed cavities below the substrate, such as an open trough or pattern of interconnected grooves, to distribute helium below the substrate. The trough or patterned grooves often stop short of the perimeter of the chuck forming a relatively large edge gap between the trough edges, or groove tips, and the perimeter of the substrate held on the electrostatic member, the gap often exceeding 10 to 20 mm. The large edge gap is provided to allow the overlying perimeter of the substrate to cover and seal the trough or grooves so that the heat transfer fluid does not leak out into the process environment. However, because no heat transfer fluid is held below the perimeter of the substrate overlying the edge gap, the temperature of the substrate perimeter is controlled less effectively compared to central portions of the substrate, resulting in non-uniform temperatures across the substrate.

Conversely, extending the edges of the trough or tips of the grooves all the way to the perimeter of the chuck causes other problems. The small gap between the trough edges, or groove tips, and the overlying substrate perimeter, can result in excessive leakage of helium at portions of the trough edges or groove tips. The accompanying reduction in temperature control of the overlying portions of the substrate perimeter, causes the substrate to exhibit hot or cold spots, and results in reduced yields of integrated circuits formed on the substrate.

Figures 1, 2A:
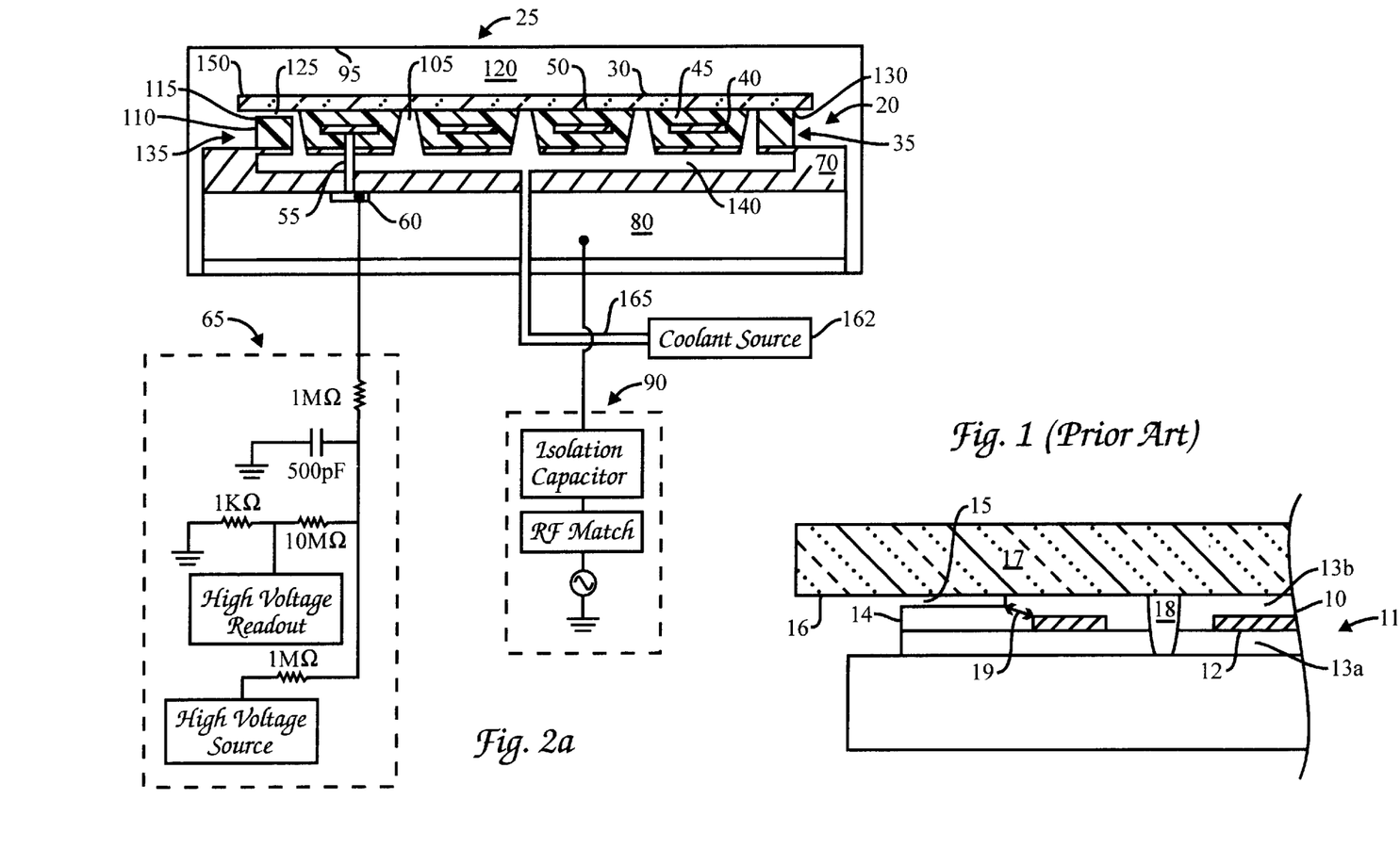
FIG. 1 (Prior Art) is a partial cross-section side schematic view of a prior art electrostatic chuck showing the annular step around the electrode where the polymer insulator rapidly erodes in an erosive environment.
FIG. 2a is a partial cross-section side schematic view of a process chamber showing operation of a monopolar electrostatic chuck of the present invention.

Another limitation of conventional chucks results from the structure of the electrostatic member 10 of the chuck 11, which typically comprises a copper electrode layer 12 sandwiched between two polymer insulator layers 13a, 13b as shown in FIG. 1. The polymer layers 13a, 13b overlap beyond the edge of the copper electrode 12 at an outer periphery 14 of the electrostatic member to electrically insulate and seal the electrode 12. Typically, the overlapping portions of the polymer layers form a lower annular step 15 of approximately 0.5 to 2 mm, and more typically 1.25 to 1.50 mm width around the circumference of the raised electrode 12. The annular step 15 has several detrimental effects on the electrostatic chuck 11. First, because of the annular step 15, only a small portion of the outer periphery 14 of the electrostatic member 10 contacts the perimeter 16 of the substrate 17 beyond the circumference of the electrode 12. As a result, there is an increased probability of helium leakage from groove tips 18 near the outer periphery 14 contributing to excessive overheating of the substrate 17. A second effect is that the relatively small width of polymer insulator 10 separating the circumference of the electrode 12 from the process environment can cause a higher failure rate of the chuck 11, because the small insulator portion 19 can be rapidly eroded by the erosive process environment, exposing the electrode 12 and causing short-circuiting of the chuck 11. Erosion of insulator portion 19 is particularly rapid in oxygen or halogen containing gases and plasmas, which are used for a variety of tasks, such as for example, etching of substrates and cleaning of process chambers. Failure of the chuck during processing of the substrate can damage the substrate, and necessitates frequent replacement of short-circuited chucks.

Thus, it is desirable to have an electrostatic chuck having a temperature controlling system that allows maintaining substantially uniform temperatures across the substrate, and in particular the perimeter of the substrate, to provide higher integrated circuit chip yields from the substrate. It is also desirable to have an electrostatic chuck which demonstrates improved erosion resistance, and reduced failure rates, in erosive process environments.

SUMMARY

The present invention provides an electrostatic chuck capable of maintaining substantially uniform temperatures across a substrate and having improved erosion resistant in an erosive process environment. One version of the electrostatic chuck comprises an electrostatic member that includes (i) an insulator covering an electrode, (ii) a substantially planar and conformal contact surface capable of conforming to the substrate, and (iii) conduits terminating at the contact surface for providing heat transfer fluid to the contact surface. Application of a voltage to the electrode of the electrostatic member electrostatically holds the substrate on the conformal contact surface to define an outer periphery having (1) leaking portions where heat transfer fluid leaks out, and (2) sealed portions where heat transfer fluid substantially does not leak out. A fluid flow regulator is provided for flowing heat transfer fluid at different flow rates through the conduits in the electrostatic member to provide (i) first flow rates of heat transfer fluid through the conduits adjacent to the sealed portions of the outer periphery of the electrostatic member, and (ii) second flow rates of heat transfer fluid through the conduits adjacent to the leaking portions, the second flow rates being higher than the first flow rates, to maintain substantially uniform temperatures across the substrate held on the chuck.

Preferably, the fluid flow regulator includes a heat transfer fluid reservoir having at least one of the following characteristics (i) the reservoir is positioned proximate to the electrostatic member, (ii) the reservoir extends across all the conduits, and (iii) the reservoir is sized and configured to hold a sufficient volume of heat transfer fluid at a sufficiently elevated pressure relative to the pressure in the process chamber, to provide the second higher flow rates of heat transfer fluid to the conduits adjacent to the leaking portions of the outer periphery of the electrostatic member. Preferably, the heat transfer fluid reservoir is sized and configured to hold heat transfer fluid at a pressure P in the range of from about $P_L$ to about $P_H$, (i) the pressure $P_H$ being sufficiently low that flow of heat transfer fluid through the conduits does not dislodge the electrostatically held substrate, and (ii) the pressure $P_L$ being sufficiently high to provide the second higher flow rates of heat transfer fluid to the conduits adjacent to the leaking portions of the outer periphery substantially without reducing the first lower flow rates of heat transfer fluid to the conduits adjacent to the sealed portions.

In another version useful for maintaining uniform temperatures across the substrate held on the chuck, the electrostatic chuck comprises a support with an electrostatic member thereon. The electrostatic member comprises an insulated electrode laminate capable of holding a substrate upon application of a voltage to the electrode. A plurality of conduits extend through the support and the electrostatic member for providing heat transfer fluid below the substrate, at least some of the conduits terminating near an outer periphery of the electrostatic member. The multiple conduits at the outer periphery of the electrostatic member distribute heat transfer fluid at multiple sources below the perimeter of the substrate improving temperature control of the substrate.

Another version of the electrostatic chuck is substantially erosion resistant and is useful for holding a substrate in an erosive process environment. In this version, the chuck comprises a support with an electrostatic member thereon. The electrostatic member comprises a laminate including (i) a first insulator layer, (ii) an electrode on the first insulator layer, and (iii) a second insulator layer over the electrode and merging with the first insulator layer around the circumference of the electrode to electrically insulate the electrode. The laminate has a contact surface for contacting the substrate that is substantially planar over the entire width of the electrostatic member so that when a substrate is electrostatically held on the contact surface, the planar contact surface provides continuous contact with the substrate to widely separate the electrode from the erosive process environment, providing enhanced erosion resistance. Preferably, the support includes an upper surface having a recess therein, and the electrode on the first insulator layer is sized to substantially fill the recess so that the laminate forms a substantially planar contact surface.

DRAWINGS

These and other features, aspects, and advantages of the present invention will become better understood with regard to the following description, appended claims, and accompanying drawings which provide illustrative examples of the invention, where:

FIG. 3b is a top view of the chuck shown in FIG. 3a;

FIG. 4b is a top view of the chuck shown in FIG. 4a;

FIG. 5b is a top view of the chuck shown in FIG. 5a; and

DESCRIPTION

Figure 2B:
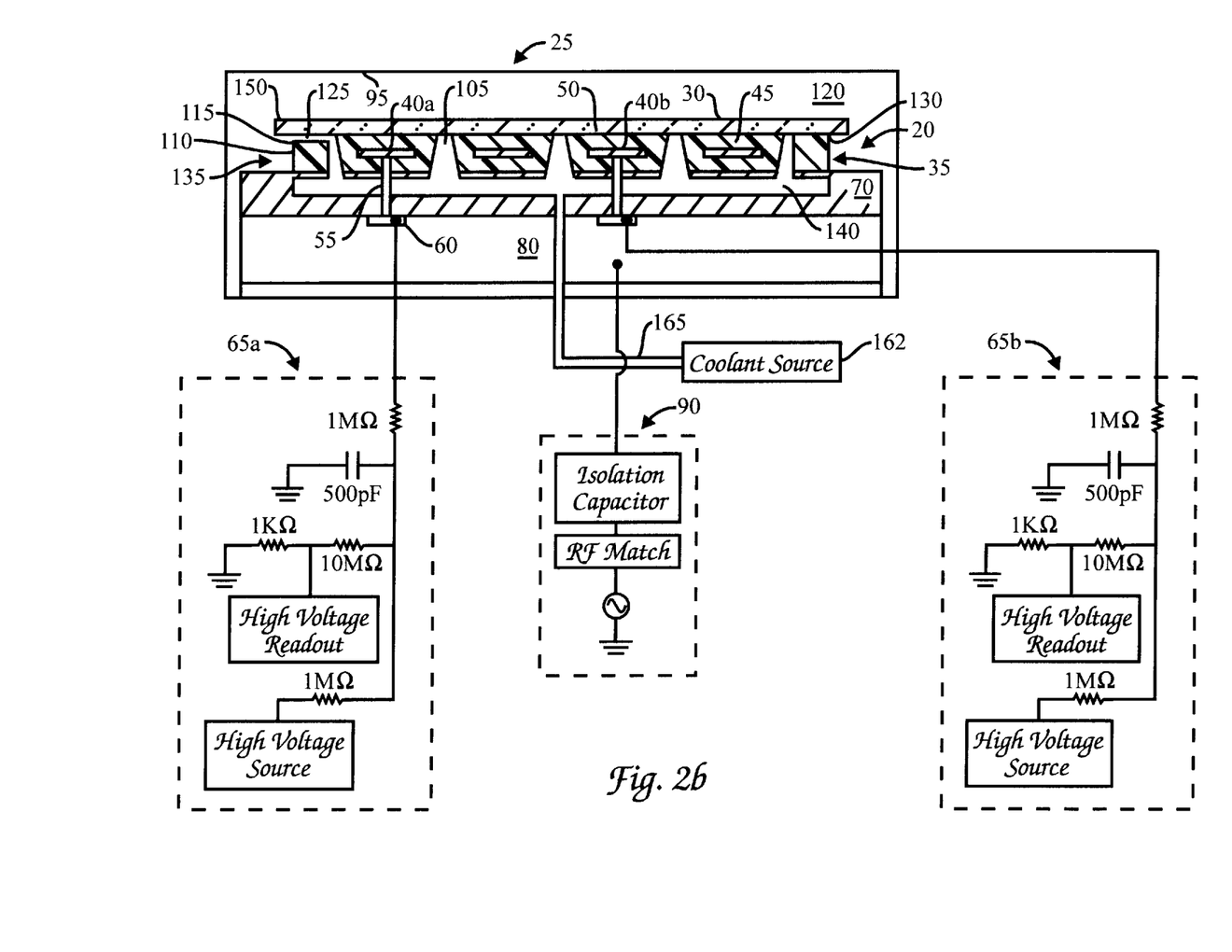
FIG. 2b is a partial cross-section side schematic view of a process chamber showing operation of a bipolar electrostatic chuck of the present invention.

With reference to FIGS. 2a and 2b, operation of an electrostatic chuck 20 of the present invention in a process chamber 25 suitable for processing a substrate 30 will be generally described. The particular embodiment of the process chamber 25 shown herein is suitable for plasma processing of substrates 30 and is provided only to illustrate operation of the chuck 20 and should not be used to limit the scope of the invention.

With reference to FIG. 2a, the electrostatic chuck 20 comprises an electrostatic member 35 having (i) a single electrode 40 with an insulator 45 covering the electrode 40, and (ii) a substantially planar and conformal contact surface 50 capable of conforming to a substrate 30. An electrical connector 55 connects the electrode 40 to a voltage supply terminal 60 in the chamber 25, to conduct a voltage suitable for operating the chuck 20. A first voltage supply 65 connected to the terminal 60 typically comprises a high voltage DC source of about 1000 to 3000 volts, connected to a high voltage readout through a 1 MΩ resistor. A 1 MΩ resistor is provided in the circuit to limit the current flowing through the circuit and a 500 pF capacitor is provided as an alternating current filter.

Typically, the electrostatic member 35 is supported by a support 70 that provides structural rigidity to the electrostatic member 35, and is designed to be secured to a process electrode, commonly known as a cathode 80, in the process chamber 25. A second voltage supply 90 is connected to the cathode 80 in the process chamber 25. At least a portion of the cathode 80 is electrically conductive, typically aluminum, and functions as a negatively biased electrode with respect to an electrically grounded surface 95 in the chamber 25. The second voltage supply 90 is conventional and electrically biases the cathode 80 by a circuit comprising an RF impedance that matches the impedance of the process chamber 25 to the impedance of the line voltage, in series with an isolation capacitor, as shown in FIG. 2a.

To operate the chuck 20, the process chamber 25 is evacuated to a pressure ranging from about 1 to about 500 mTorr, and more typically from about 10 to about 100 mTorr. A semiconductor substrate 30, such as a silicon wafer, is transferred to the chamber 25 from a load lock transfer chamber (not shown), and placed on the conformal contact surface 50 of the electrostatic member 35. Process gas for etching or depositing material on the substrate 30 is introduced in the chamber 25. Suitable process gases are generally described in S. Wolf and R. N. Tauber, *Silicon Processing for the VLSI Era*, Vol. I, Lattice Press, Sunset Beach, Calif. (1986), which is incorporated herein by reference. A plasma is formed from the process gas by activating the second voltage supply 90 to electrically bias the cathode 80 with respect to the grounded surface 95 of the chamber 25.

The voltage applied to the monopolar electrode 40 causes electrostatic charge to accumulate in the electrode 40, and the plasma in the chamber 25 provides electrically charged species having opposing polarity which accumulate in the substrate 30. The accumulated opposing electrostatic charge results in an attractive electrostatic force between the substrate 30 and the electrode 40 in the chuck 20, causing the substrate 30 to be electrostatically held to the chuck 20.

Instead of a single electrode 40, the electrostatic member 35 of the chuck 20 can comprise two bipolar electrodes 40a, 40b, as shown in FIG. 2b. The two bipolar electrodes 40a, 40b are typically coplanar to one another and have substantially equivalent areas to generate equivalent electrostatic forces. The first voltage supply 65 powering the bipolar electrodes in the chuck 20 can have several alternative configurations. In a preferred configuration, the first voltage supply 65 comprises first and second voltage sources 65a, 65b, which provide negative and positive voltages to the first and second electrodes 40a, 40b, respectively to maintain the electrodes 40a, 40b at negative and positive electric potentials. The opposing electric potentials induce opposing electrostatic charges in the electrodes 40a, 40b and in the substrate 30 held to the chuck 20, without use of a plasma in the process chamber 25, causing the substrate 30 to be electrostatically held to the chuck 20. Bipolar electrode configurations are advantageous for non-plasma processes in which there are no charged plasma species to serve as charge carriers for electrically biasing the substrate.

The chuck 20 further comprises a plurality of conduits 105 terminating at the contact surface 50 of the electrostatic member 35 to provide heat transfer fluid, typically helium, below the substrate 30 to maintain uniform temperatures across the substrate 30. When the monopolar electrode 40, or the bipolar electrodes 40a, 40b are activated to impart opposing electrostatic charge to the substrate 30 and the electrode 40, the substrate 30 is attracted toward and presses against the conformal contact surface 50 of the electrostatic member 35. Typically, on a microscopic level, only a small portion of the substrate 30 actually contacts the contact surface 50. Heat transfer fluid below the substrate 30 flows into the microscopic gap between the substrate 30 and the contact surface 50, providing thermal coupling by gas conduction between the substrate 30 and the contact surface 50, allowing enhanced thermal transfer between the non-contacting portions of the substrate 30 and the contact surface 50. The substrate 30 presses against the contact surface 50 to define an outer periphery 110 having (i) leaking portions 115 where heat transfer fluid leaks out to the process environment 120 from between gaps 125 in the outer periphery 110, and (ii) non-leaking or sealed portions 130 where there are substantially no gaps in the outer periphery 110 and substantially no heat transfer fluid leaks out.

The heat transfer fluid can be any liquid or gas capable of transferring heat to the substrate 30, or removing heat from the substrate 30. Preferably, the heat transfer fluid comprises a non-reactive gas that is substantially non-reactive to the process environment in the process chamber 25 so that leaking heat transfer fluid does not adversely affect the processes performed on the substrate 30. The non-reactive gas should also be non-reactive to the materials used to fabricate the chuck 20, and in particular, to the conformal contact surface 50 which is in contact with the non-reactive gas.

For example, when polymeric materials such as polyimide are used to fabricate the conformal contact surface 50, reactive gases that erode polyimide, such as (i) oxygen, or (ii) halogen-containing gases, such as $CF_4$ or $C_2F_6$, should be avoided. Preferably, the heat transfer fluid has an elevated thermal conductivity to provide optimal thermal transfer rates between the substrate 30 and the chuck 20. Preferred heat transfer fluids that are non-reactive to the process environment and conformal contact surface, and that have elevated thermal conductivity comprise helium, argon, nitrogen and the like. The thermal conductivity at about room temperature of argon is about $43 \times 10^{-6}$, nitrogen is about $62 \times 10^{-6}$, and helium is about $360 \times 10^{-6}$ in cal/(sec) $(cm^2)(°C./cm)$. Thus, by elevated thermal conductivity, it is meant a room temperature thermal conductivity of about 40 to about 360 cal/(sec)$(cm^2)(°C./cm)$.

The heat transfer fluid can be used to cool or heat the substrate 30 to achieve uniform temperatures on the substrate 30. When cooling of the substrate is needed, the chuck 20 is maintained at a lower temperature than the substrate 30, so that the heat transfer fluid can transfer heat from the substrate 30 to the chuck 20. Alternatively, when the substrate is to be heated, the chuck 20 is maintained at a higher temperature than the substrate 30, so that the heat transfer fluid can transfer heat from the chuck 20 to the substrate 30.

The electrostatic chuck 20 of the present invention provides improved temperature control of the substrate 30 by use of a fluid flow regulator 135 capable of flowing heat transfer fluid at different flow rates through the conduits 105 to offset leakage of heat transfer fluid from leaking portions 115 of the outer periphery 110 of the electrostatic member 35. This reduces the formation of "hot spots" or "cold spots" on the portions of the substrate 30 overlying the leaking portions 11 5, allowing maintaining the substrate 30 at uniform temperatures. The fluid flow regulator 135 provides (i) first lower volumetric flow rates of heat transfer fluid through the conduits 105 adjacent to the sealed portions 130 of the outer periphery 110 of the electrostatic member 35, and (ii) second higher volumetric flow rates of heat transfer fluid through the conduits 105 adjacent to the leaking portions 115, without reducing the flow rates of heat transfer fluid to the non-leaking portions of the outer periphery 110. Preferably, the second flow rates of heat transfer fluid to the conduits 105 adjacent to the leaking portions 115 of the outer periphery 110 are at least about 2 sccm higher, and more preferably at least about 5 sccm higher, than the first flow rates of heat transfer fluid to the conduits 105 adjacent to the sealed portions 130. Typically, the first flow rates range from about 0 to about 1 sccm, and the second flow rates range from about 1 sccm to about 10 sccm.

Figure 3A:
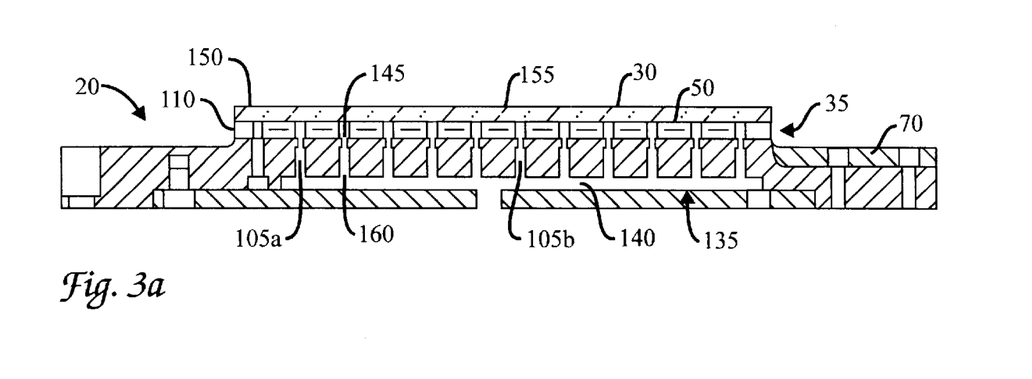
FIG. 3a is a cross-section side schematic view of a version of the chuck comprising a fluid flow regulator in the support.
Figure 3B:
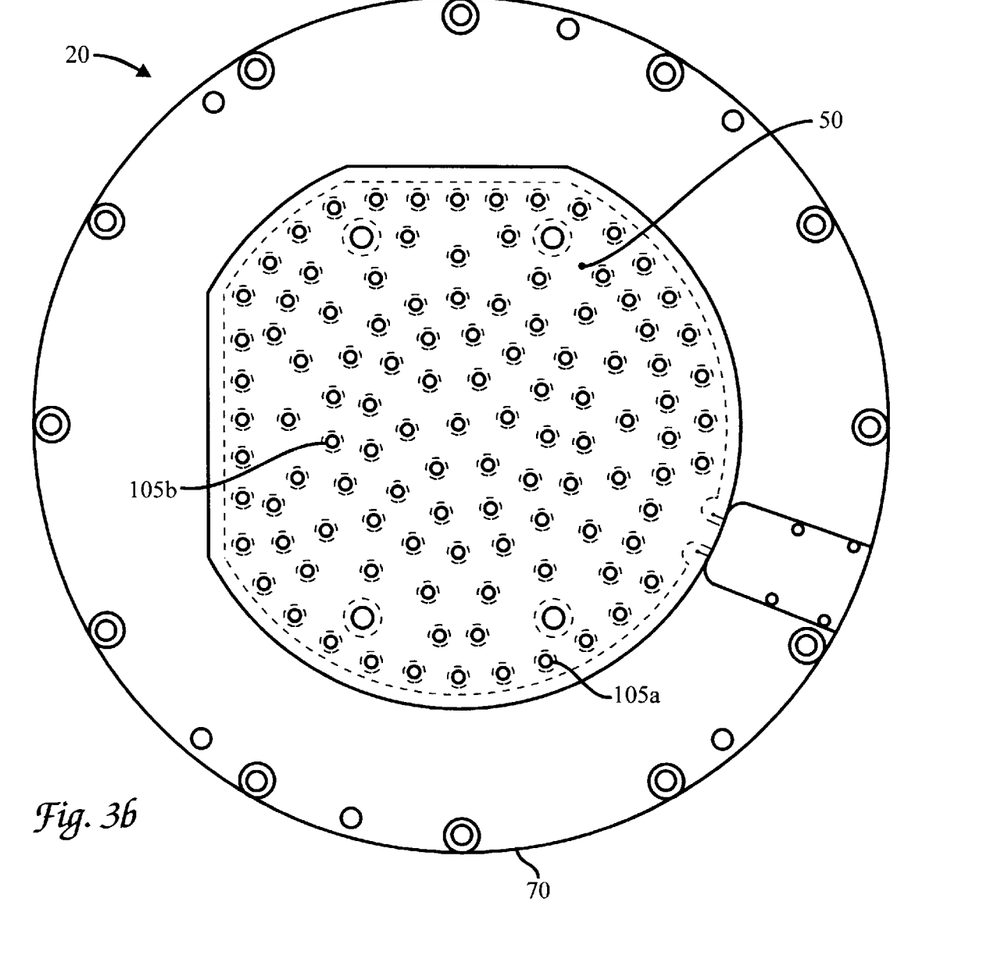

Typical heat transfer fluid flow regulator structures 135 will now be described. One version of the fluid flow regulator 135 includes a heat transfer fluid reservoir 140 formed in the support 70 below the electrostatic member 35, the length of the reservoir 140 extending across all of the conduits 105 to provide a short flow path between the conduits 105 and the heat transfer fluid reservoir 140. Multiple conduits 105, typically from about 50 to about 500 conduits, and more typically 100 to 200 conduits, extend from the heat transfer fluid reservoir 140 to the contact surface 50 of the electrostatic member 35. As shown in FIG. 3a, the conduits 105 include peripheral conduits 105a near a perimeter 150 of the substrate 30, as well as central conduits 105b at central portions 155 of the substrate 30. Typically, the peripheral conduits 105a are located within about 10 mm, and more preferably within 5 mm from the perimeter 150 of the substrate 30. The peripheral conduits 105a and central conduits 105b are uniformly spaced apart and distributed across substantially the entire contact surface 50 to provide multiple sources of heat transfer fluid below the substrate 30. The multiple sources of heat transfer fluid allow the heat transfer fluid to be uniformly distributed below the substrate 30. Suitable distributions of the peripheral and central conduits 105a, 105b are shown in FIG. 3b, 4b and 5b.

The conduits 105a, 105b have first ends 145 at the contact surface 50, and second ends 160 at the reservoir 140. Preferably, the conduits 105 are tapered, the first ends 145 having smaller diameters than the second ends 160. Tapering of the conduits 105 provides optimal control of the flow of heat transfer fluid from the reservoir 140 to the conduits 105. The small diameters of the first ends 145, by their small size, prevent excessive flow of heat transfer fluid to leaking portions 115 of the outer periphery 110 of the contact surface 50. The relatively larger diameter second ends 160 allow ingress of the heat transfer fluid from the reservoir 140 into the conduits 105 without impeding or obstructing the flow of the fluid into the conduits 105. Also, tapering of the conduits 105 from the larger seconds ends 160 to the smaller first ends 145, increases the velocity of heat transfer fluid as the heat transfer fluid passes through the conduit 105. The high velocity heat transfer fluid travels at faster rates to the leaking portions 115 of the outer periphery 110 of the contact surface 50, thereby rapidly providing heat transfer fluid to the substrate 30 to provide more effective temperature control of the substrate 30. In this manner, the tapered conduits 105 function in combination with the proximately located heat transfer fluid reservoir 140 to rapidly provide heat transfer fluid to leaking portions 115 of the outer periphery 110 at sufficient flow rates, and without reducing the flow rates of heat transfer fluid to the sealed portions 130 of the outer periphery 110, to maintain uniform temperatures across the substrate 30. Thus, preferably, the first ends 145 of the conduits 105 have diameters less than about 1 mm, more preferably less than about 0.5 mm, and most preferably, the diameter of the first ends 145 range from about 0.25 to about 0.5 mm. Preferably, the diameters of the second ends 160 are at least about 1.5 mm and more preferably range from about 1.5 to about 2.5 mm.

As shown in FIGS. 2a and 2b, a heat transfer fluid source 162, such as a tank of compressed helium, connected to the reservoir 140 via a supply line 165, is used to maintain heat transfer fluid in the reservoir 140 at an elevated pressure P, relative to the pressure in the process chamber 25.

Preferably, the pressure P ranges from a lower pressure $P_L$ to a higher pressure $P_H$. The higher pressure $P_H$ is selected to be sufficiently low that flow of heat transfer fluid through the conduits 105 does not dislodge the electrostatically held substrate 30. Typically, the electrostatic member 35 exerts an electrostatic attractive force per unit area on the substrate 30 of at least about 5 Torr, and more typically from about 10 to about 100 Torr, and most typically from 20 to 60 Torr. Thus, heat transfer fluid should exit from the first ends 145 of the conduits 105 with a pressure less than the attractive electrostatic pressure exerted by the electrostatic member 35 on the substrate 30, (i) to prevent movement or dislodging of the substrate 30, and (ii) to allow the substrate 30 to at least partially seal the outer periphery 110 of the electrostatic member 35 to reduce leaking of heat transfer fluid from the outer periphery 110. Thus, the pressure $P_H$ is preferably less than about 100 Torr, and more preferably less than about 60 Torr. The lower pressure $P_L$ is selected to be sufficiently high to provide higher flow rates of heat transfer fluid to the conduits 105 adjacent to the leaking portions 115 of the outer periphery 110, relative to the flow rates of heat transfer fluid to the conduits 105 adjacent to the sealed portions 130, substantially without reducing the flow rate of heat transfer fluid to the conduits 105 adjacent to the sealed portions 130. Preferably, the lower pressure $P_L$ is at least about 1 Torr, and more preferably is at least about 10 Torr, and more typically at least about 20 Torr. Thus, the heat transfer fluid in the reservoir is most preferably maintained at a pressure P in a range $\Delta P$ of from about 10 to about 100 Torr, and more preferably from 20 to 60 Torr.

The heat transfer fluid reservoir 140 provides a "capacitor-like" pressurized source of heat transfer fluid proximate to the conduits 105 to provide high heat transfer fluid flow rates to the leaking portions 115 of the outer periphery 110 substantially without reducing flow rates of heat transfer fluid to the sealed portions 130 to maintain substantially uniform temperatures across the substrate 30. The short flow path between the conduits 105 and the reservoir 140, the pressured heat transfer fluid reservoir 140 and tapered shape of the conduits 105, allow rapid dissemination of heat transfer fluid at high flow rates to leaking portions 115 of the outer periphery 110 of the electrostatic member 35 to maintain the substrate 30 at uniform temperatures.

The fluid flow regulator 135 provides significant advantages over the prior art by maintaining the difference in temperatures across the surface of the substrate 30, or between the perimeter 150 and central portion 155 of the substrate 30, typically less than about 10° C., and often less than about 5° C. For example, substrates processed at temperatures of about 400° C. can be uniformly cooled to temperatures less than about 100° C., and more typically less than about 80° C., using the fluid flow regulator 135.

Figure 4A:
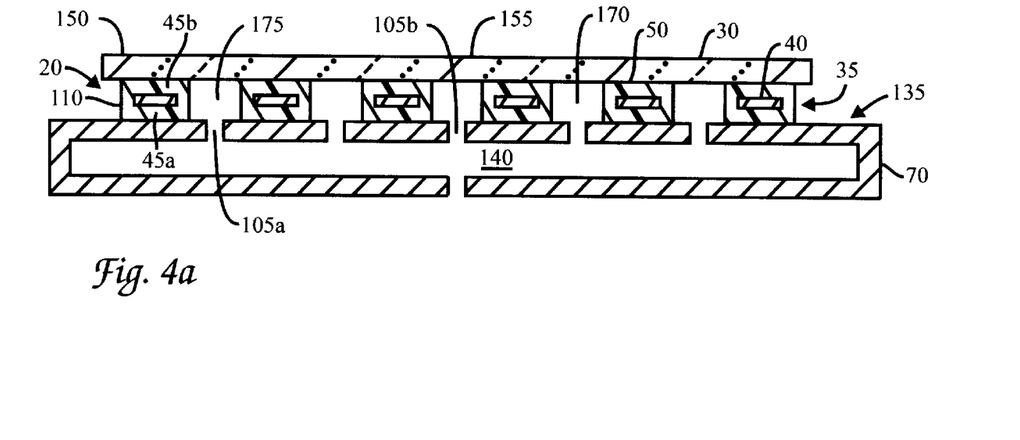
FIG. 4a is a partial cross-section side schematic view of another version of the chuck of the present invention.
Figure 4B:
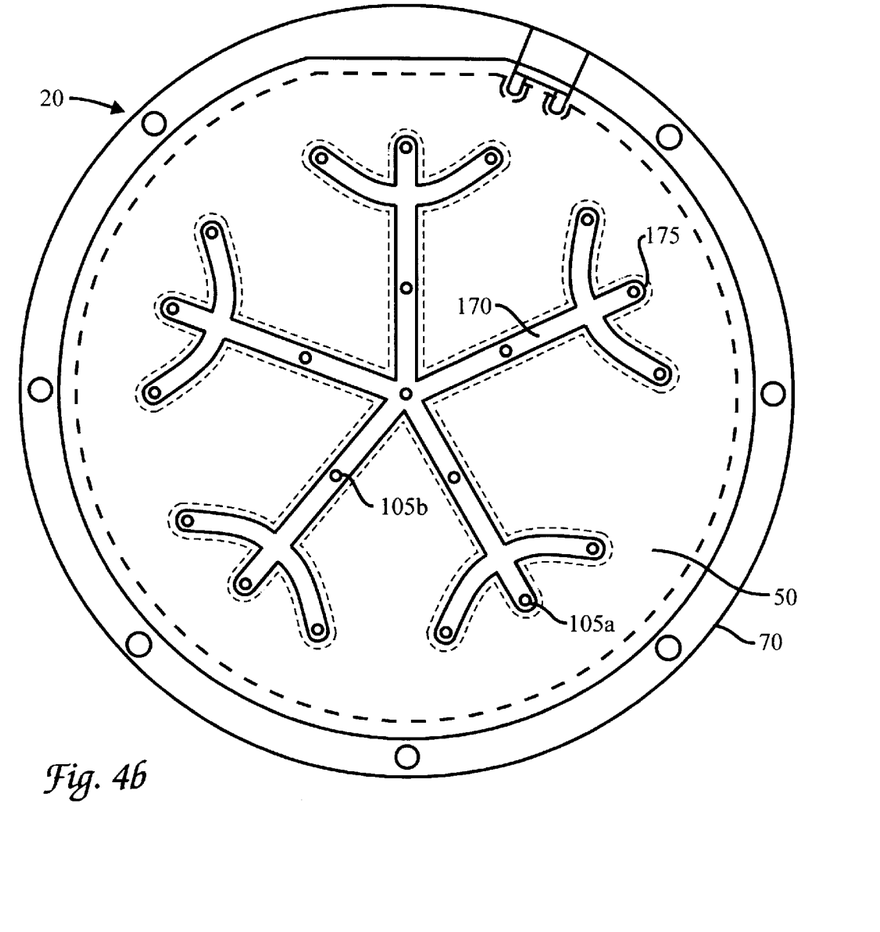

The version of the chuck 20 shown in FIGS. 4a and 4b includes grooves 170 in the electrostatic member 35, the tips 175 of the grooves 170 positioned close to the perimeter 150 of the substrate 30. In this version the first ends 145 of the peripheral conduits 105a terminate in the grooves tips 175 to provide heat transfer fluid to the outer periphery 110 of the contact surface 50 to maintain the substrate perimeter 150 at substantially uniform temperatures. The grooves 170 typically form a pattern of circumferentially and radially intersecting channels to distribute heat transfer fluid below the substrate 30. Preferably, the distance between the groove tips 175 and the perimeter 150 of the substrate 30 is less than about 7 mm, more preferably from about 1 mm to about 5 mm, and most preferably less than about 3 mm. When a substrate 30 is electrostatically held on the chuck 20, the substrate 30 covers the grooves 170 and substantially seals the groove tips 175 to reduce leaking of heat transfer fluid from the groove tips 175.

Figure 5A:
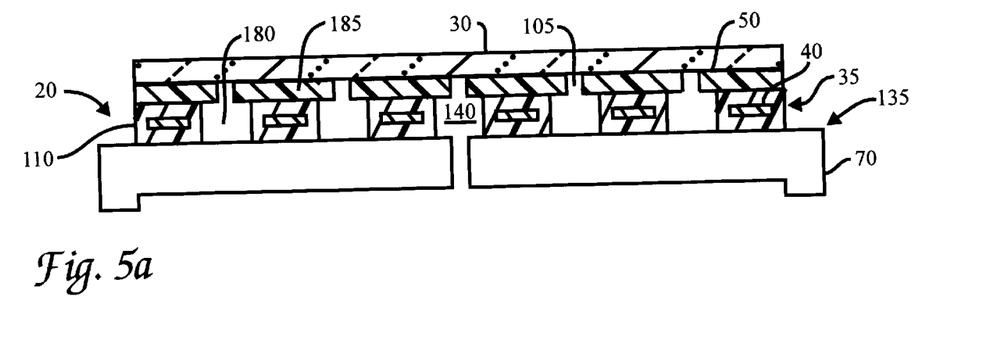
FIG. 5a is a partial cross-section side schematic view of another version of the chuck of the present invention.
Figure 5B:
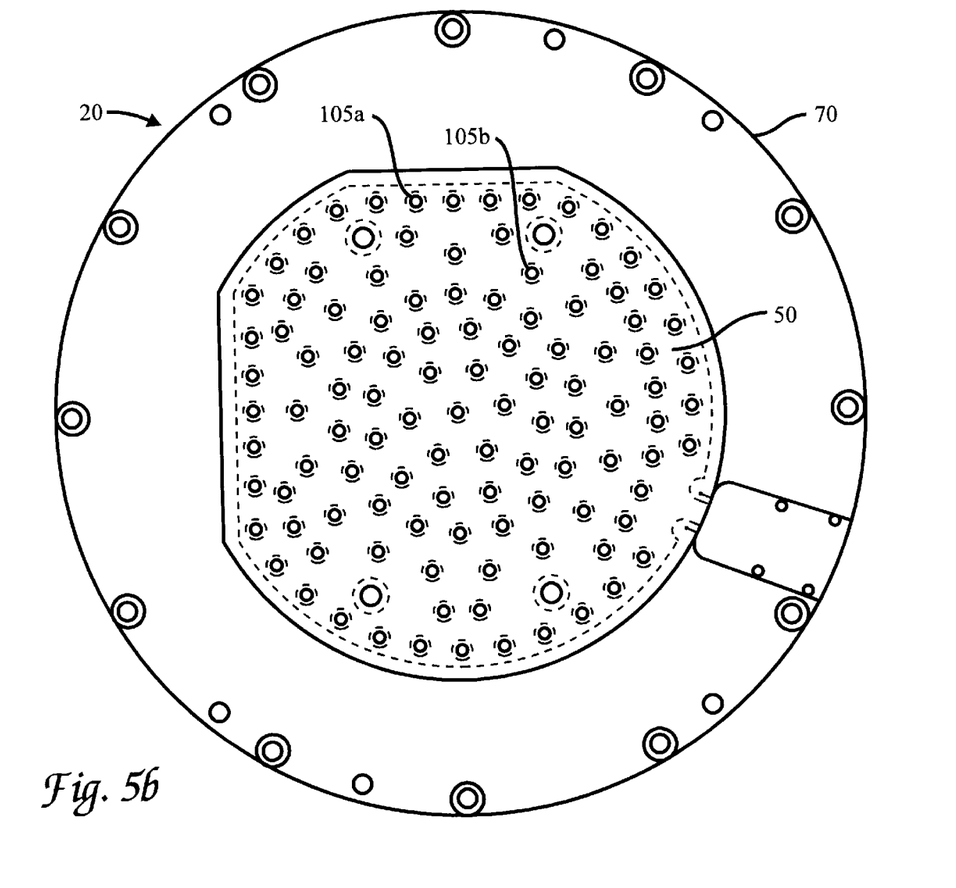

In the version of the chuck shown in FIGS. 5a and 5b, the heat transfer fluid reservoir 140 comprises channels 180 which are formed in the electrostatic member 35. A resilient contact layer 185 covers and seals the channels 180. The resilient contact layer 185 is capable of conforming to the substrate 30 under the applied electrostatic force, and is substantially planar across the entire width of the electrostatic member 35. In this version, the conduits 105 extend from the heat transfer fluid reservoir channels 180, through the contact layer 185, and terminate at the contact surface 50 of the contact layer 185 to provide heat transfer fluid below the substrate 30.

Figure 6:
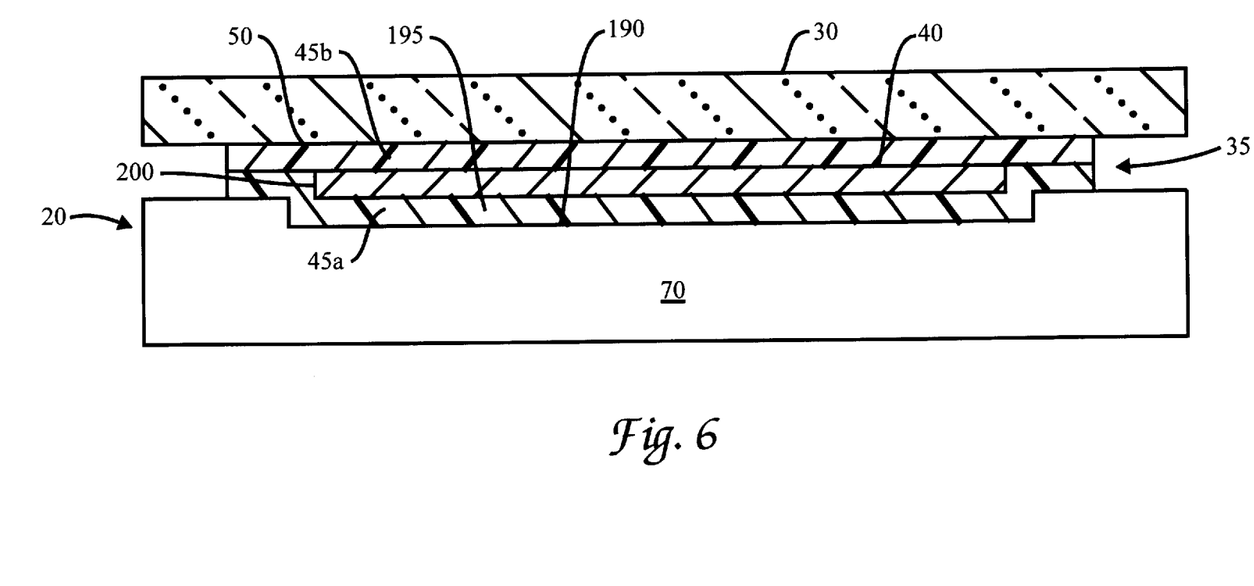
FIG. 6 is a partial cross-section side schematic view of an erosion resistant chuck of the present invention.

In another aspect of the invention, useful for chucks 20 which are used in erosive process environments, the erosion resistance of the chuck 20 can be increased using an electrostatic member 35 having a contact surface 50 that is substantially planar over its entire width. The continuously planar electrostatic member 35 provides continuous contact with the substrate 30, and widely separates the electrode 40 from the erosive process environment. In the version shown in FIG. 6, the support 70 supporting the electrostatic member 35 includes an upper surface 190 having a recess 195 counterbored therein. The recess 195 is sized so that the electrode 40 of the electrostatic member 35 can fit therein and typically has a diameter about 0.1 to 0.2 mm larger than the diameter of the electrode 40, and a depth approximately equal to the thickness of the electrode 40 which is typically about 0.040 mm. The electrostatic member 35 is constructed as a laminated insulated electrode, by forming (i) a first insulator layer 45a on the recessed 195 upper surface 190 of the support 70, (ii) an electrode 40 on the first insulator layer 45a, and (iii) a second insulator layer 45b covering the electrode 40. The first insulator layer 45a with the electrode 40 thereon, has a combined thickness sized to substantially fill the recess 195 so that when the second insulator layer 45b is formed over the electrode 40, the contact surface 50 of the laminate forms a continuous and unitary planar surface that continuously contacts the substrate 30 beyond the outer diameter 200 of the electrode 40. The continuous contact surface 50 reduces helium leakage, and provides an insulator barrier having a width of about 1.5 mm between the electrode 40 and the erosive process environment, which is about 30 times more than the length of prior art insulator barriers, thereby widely separating the electrode 40 from the erosive process environment, and extending the useful life of the chuck 20.

The erosion resistance of the chuck 20 can also be increased using a masking gas assembly (not shown) that directs an inert masking gas onto the outer periphery 110 of the electrostatic member 35, as described in U.S. patent application Ser. No. 08/410,449, filed on Mar. 24, 1995, entitled "Electrostatic Chuck with Improved Erosion Resistance, by Shamouilian, et al., which is incorporated herein by reference. Erosion resistance can also be enhanced using a barrier that is circumferentially disposed about the electrostatic member 35, and presses against the substrate 30 and support 70, to form a seal between the substrate 30 and the support 70 to reduce exposure of the electrostatic member 35 to the erosive environment, as described in U.S. patent application Ser. No. 08/439,010, filed on May 11, 1995, entitled, "Barrier Seal for Electrostatic Chuck," by Salfelder, et al., which is incorporated herein by reference.

Methods of manufacturing different versions of the electrostatic chuck 20 of the present invention will now be discussed.

The electrostatic chuck 20 version shown in FIG. 3a and 3b, includes a support 70 for supporting the electrostatic member 35. Typically, the support 70 is shaped and sized according to the shape and size of the substrate 30 to maximize the heat transfer surface between the support 70 and the substrate 30. For example, a right cylindrical support having a diameter of about 100 to 300 mm is preferred for a disk shaped substrate having a diameter of from about 125 to about 200 mm (5–8 inches). The support 70 is typically machined from a metal, such as aluminum plate having a thickness of from about 1.5 to 2 cm. Conventional grinding techniques are used to grind the surface of the support 70 to a roughness of less than about 1 micron, to provide a smooth thermal transfer surface between the substrate 30, electrostatic member 35, and support 70.

The heat transfer fluid reservoir 140 in the support 70 can be formed by forming a hollow counterbored cavity in the back of the support 70 to a depth of about 3 to 5 mm, and a diameter of about 120 to 190 mm to extend across all the conduits 105, and securing a plate to cover the cavity, as shown in FIG. 3a. Preferably the volume of the heat transfer fluid reservoir is from about 50 to about 150 cm$^3$. Typically, the walls of the heat transfer fluid reservoir 140 should have a thickness of at least about 5 to 10 mm to provide a sufficiently strong enclosure to maintain heat transfer fluid at the elevated pressure P in the reservoir 140. A heat transfer fluid gas inlet 210 for introducing heat transfer fluid into the reservoir 140 is formed in the plate. Multiple conduits 105 are machined through the top of the support 70. The conduits typically comprise about 50 to about 500 conduits, and more typically 100 to 200 conduits, many of the conduits 105 positioned close to the outer edge of the support 70, as shown in FIG. 3b.

The electrostatic member 35 on the support 70 comprises (i) an electrode 40, and (ii) an insulator 45 covering the electrode 40. The electrode 40 of the electrostatic member 35 is typically made from an electrically conductive material, such as for example, metals including copper, nickel, chromium, aluminum, iron, and alloys thereof. Typically, the thickness of the electrode 40 is from about 0.5 $\mu$m to 100 $\mu$m, and more typically from about 1 $\mu$m to 50 $\mu$m. The shape of the electrode 40 varies according to the size and shape of the substrate 30. For example, if the substrate 30 is disk shaped, the electrode 40 is also disk shaped to maximize the area of the electrode 40 in contact with the substrate 30. Typically, the electrode 40 has an area of from about 200 to about 400 sq mm, and more typically from about 250 to about 350 sq mm. Typically, the electrode 40 is a continuous or patterned metal layer.

The insulator 45 is sized sufficiently large to cover and more preferably enclose the electrode 40, the upper surface of the insulator forming the contact surface 50 of the electrostatic member 35. Preferably, the insulator 45 comprises a resilient polymeric dielectric material, such as polyimide, polyketone, polyetherketone, polysulfone, polycarbonate, polystyrene, nylon, polyvinylchloride, polypropylene, polyethersulfone, polyethylene terephthalate, fluoroethylene propylene copolymers, cellulose triacetates, silicone, and rubber. The resilient polymeric insulator layer 40 provides a cushioning contact surface 50 that allows at least a portion of the perimeter 150 of the substrate 30 to form a seal with the contact surface 50 of the electrostatic member 35, thereby reducing leaking of heat transfer fluid from below the substrate 30. When a polymer such as polyimide is used, the resilience of the polyimide, as measured by the tensile elastic modulus of the polyimide, is typically from about 0.25 to about 10 GPa, and more typically from about 1 to about 5 Gpa.

The thickness of the insulator 45 required to electrically insulate the electrode 40 varies according to the electrical resistivity and dielectric constant of the polymer used to form the insulator 45. Also, the insulator 45 should have a sufficient thickness to allow the contact surface 50 to conform to the substrate 30 under the electrostatic clamping force applied on the substrate 30. Typical polymeric insulators have (i) a dielectric constant of at least about 2, and more preferably at least about 3; (ii) a resistivity ranging from about $10^{13}$ Ωcm to $10^{20}$ Ωcm; and (iii) a dielectric breakdown strength of at least about 100 volts/mil (3.9 volts/micron), and more typically at least about 1000 volts/mil (39 volts/micron). When the polymer has a dielectric constant of about 3.5, the insulator is typically about 10 μm to about 500 μm thick, and preferably from about 100 μm to about 300 μm thick.

Preferably, the insulator 45 is resistant to temperatures in excess of 50° C., and more preferably resistant to temperatures in excess of 100° C., so that the chuck 20 can be used in processes where the substrate 30 is heated. Also, preferably, the polymeric insulator 45 has a high thermal conductivity so that heat generated in the substrate 30 during processing can dissipate through the chuck 20. The thermal conductivity of the insulator 45 should be at least about 0.10 Watts/m/°K., to allow sufficient heat transfer to preclude overheating of the substrate 30. The insulator 45 can also include a high thermal conductivity filler material, such as diamond, alumina, zirconium boride, boron nitride, and aluminum nitride for increasing the thermal conductivity and resistance to plasma corrosion. Preferably, the filler material is a powder with an average particle size of less than about 10 μm. Typically, the filler is dispersed in the insulator material in a volumetric ratio from about 10% to 80%, and more typically from about 20% to 50%.

One method of fabricating the electrostatic member 35 uses an electrically conductive layer, such as a metal layer, sandwiched between two commercially available insulator layers 45a, 45b to form a laminated structure. Suitable commercially insulative polymer films include for example, "KAPTON," a polyimide film manufactured by DuPont de Nemours Co., Wilmington, Del.; "APIQUEO" fabricated by Kanegafuchi Chemical Indus., Japan;

"UPILEX" manufactured by Ube Indus. Ltd., Japan; "NITOMID" fabricated by Nitto Electric Indus. Co. Ltd., Japan; and "SUPERIOR FILM" fabricated by Mitsubishi Plastics Indus. Ltd., Japan. Typically, the thickness of each insulator layer is from about 50 μm to about 100 μm. Conventional adhesives are used to adhere the insulative layers 45a, 45b to the electrode 40, such as (i) thermally activated adhesives which are non-tacky at room temperatures and tacky at elevated temperatures, or (ii) pressure sensitive adhesives which are tacky under pressure. Suitable adhesives include for example acrylics such as methacrylate, polyesters, polyamides, polyurethanes, epoxies, silicone containing adhesives, and mixtures thereof. Methods of fabricating the electrostatic member laminate are generally described in the U.S. patent application Ser. No. 08/199,916, entitled "Electrostatic Chuck with Erosion-Resistant Electrode Connection," filed Feb. 22, 1994, by Shamouilian, et al.

The electrostatic member laminate 45 is punched or pressed to form holes having a diameter corresponding to the desired diameter for the first ends 145 of the conduits 105, of about 0.25 to about 0.5 mm. The hole-punched electrostatic member laminate 45 is then centered on the support 70, and the holes in the laminate 45 are aligned with the holes in the support 70 to form a continuous conduits 105 between the heat transfer fluid reservoir 140 and the contact surface 50. The electrical connector 55 of the electrostatic member 35 is then extended through the support 70, so that the substrate 30 covers the electrical connector 55 during processing, to reduce exposure of the connector to the erosive process gases in the chamber 25. Preferred electrical connectors 55 are described in aforementioned U.S. patent application Ser. No. 08/410,449, filed on Mar. 24, 1995, entitled "Electrostatic Chuck with Improved Erosion Resistance, by Shamouilian, et al., which is incorporated herein by reference.

The electrostatic member 35 of the version of the chuck 20 shown in FIG. 4a can be fabricated using a multilayer film, comprising an insulator layer 45a having an electrically conductive copper or aluminum layer thereon. Suitable commercially available multilayer films include for example, "R/FLEX 1100" film comprising a 25 to 125 μm thick polyimide film with a copper layer deposited thereon, from Rogers Corporation, Chandler, Ariz.; Ablestik brand aluminum-filled polyimide film available from Ablestik Corporation; and Paralux® AP film, comprising polyimide directly bonded (without an adhesive) to rolled, annealed, or electrodeposited copper foil. The grooves 170 are interposed between segments of the electrode 40, as shown in FIG. 4a, by etching, routing or milling the conductive layer to form grooves 170 between the patterned or segmented electrode 40. For example, conventional photolithographic etching methods can be used to etch the electrode 30 by (i) forming a patterned photoresist layer of "RISTON" fabricated by DuPont de Nemours Chemical Co. on the conductive metal layer using conventional photolithographic methods, as generally described in *Silicon Processing for the VLSI Era. Volume 1: Process Technology*, Chapters 12 to 14, by Stanley Wolf and Richard N. Tauber, Lattice Press, California (1986), which is incorporated herein by reference, and (ii) etching the exposed portions of the conductive layer using conventional wet or plasma etching techniques. In a typical wet chemical etching method, the multilayer film is immersed in an etching solution, such as ferric chloride, sodium persulfate, or into an acid or base. A typical plasma etching processes uses a plasma of chlorine, oxygen, or $SiCl_4$, to etch the conductive layer, as generally described in *VLSI Technology, Second Edition*, Chapter 5, by S. M. Sze, McGraw-Hill Publishing Company (1988), which is incorporated herein by reference. Residual photoresist can be removed using a conventional acid or oxygen plasma stripping process. After etching, a second insulator film 45b is adhered over the electrode 40 to embed the electrode 40 within the insulator forming the electrostatic member 35. The grooves 170 are then cut through one or both insulative layers 45a, 45b of the multilayer insulator by stamping, pressing, or punching the grooves 170, as shown in FIG. 4b. The groove punched electrostatic member 35 is centered on the support 70 so that the tips of the grooves 175 are positioned over the peripheral conduits 105a.

The version of the chuck shown in FIG. 5a, is fabricated by forming an electrostatic member 35 using a multilayer film as described above. After etching the conductive layer of the multilayer film to form a segmented electrode 40, a second insulator film 40b is adhered over the electrode 40 to form a laminate structure. The reservoir channels 180 are then punched through the laminate structure. Thereafter, a third resilient polyimide film 185 having the conduits 105 punched therethrough, is adhered over the reservoir channels 180 to form the heat transfer fluid reservoir 140 within the electrostatic member 35.

Electrostatic chucks 20 having the fluid flow regulator 135 of the present invention provide significantly improved temperature uniformity across the substrate 30 over prior art chucks. For example, a test of a prototype of the invention for cooling a substrate in a tungsten etch process resulted in an overall reduction of the temperature of the substrate 30 of approximately 10° C. and a reduction of the temperature of the perimeter of the substrate 30 from 80° C. to approximately 60°–65° C. Also, the temperature gradient between the central portion 155 and the perimeter 150 of the substrate 30 was reduced from 15°–20° C. to 6°–10° C. Repeatable and acceptable process results were obtained using the chuck 20.

Furthermore, it appears from test results on the prototype of the invention that heat transfer fluid leaking from the leaking portions 115 of the outer periphery 110, that might have been regarded as excessive in prior art chucks, is not detrimental using an electrostatic chuck of the present invention. The chuck 20 of the present invention provides sufficient heat conductance and a sufficient supply of heat transfer fluid at an elevated pressure proximate to the leaking portion 115, to provide sufficiently high flow rates to offset leakage of heat transfer fluid from leaking portions 115. Whereas, heat transfer fluid leakage of approximately 0.2 to 1 sccm from the outer periphery of prior art chucks often result in substrate overheating; leakage in the range of 2 to 5 sccm at 9 Torr pressure in a chuck 20 of the present invention showed no detectable overheating effect on the substrate 30. Also, it was determined that blocking the outside conduits 105 in the leaking portions 115 of the outer periphery 110 which leaked, reduced leakage by a factor of approximately 10, i.e., to 0.4 to 0.6 sccm, but resulted in overheating of the substrate perimeter. Therefore, blockage of leakage gaps 115 does not provide as effective a solution to the overheating problem as the chuck of the present invention.

It will be appreciated from the foregoing that the present invention represents a significant advance in the field of electrostatic chucks. In particular, the electrostatic chuck 20 of the invention provides more efficient temperature control over the entire substrate 35 surface, especially the perimeter 150 of the substrate 30, improved thermal transfer and contact at the outer periphery 110, and increased useful product life.

While the present invention has been described in considerable detail with reference to certain preferred versions, many other versions should be apparent to those skilled in the art. For example, although illustrative fluid flow regulator 135 configurations are described herein, the fluid flow regulator 135 can comprise any structure that would be apparent to one of ordinary skill in the art. Therefore, the spirit and scope of the claims herein should not be limited to the description of the preferred versions contained herein.

What is claimed is:

1. A method of holding a substrate on an electrostatic chuck member, and maintaining substantially uniform temperatures across the substrate using heat transfer fluid supplied from a reservoir via tapered conduits extending through the electrostatic member, the method comprising the steps of:

(a) electrostatically holding the substrate on the electrostatic member to define an outer periphery comprising leaking portions having gaps therein, and sealed portions having substantially no gaps therein; and (b) flowing heat transfer fluid from the reservoir at different flow rates through the tapered conduits to provide (i) first flow rates through the conduits adjacent to the sealed portions of the outer periphery, and (ii) second flow rates through the conduits adjacent to the leaking portions of the outer periphery, the second flow rates being higher than the first flow rates to offset leakage of heat transfer fluid through the leaking portions to maintain substantially uniform temperatures across the substrate held on the chuck.

2. The method of claim 1, wherein the heat transfer fluid comprises a non-reactive gas having an elevated thermal conductivity.

3. The method of claim 1, wherein the non-reactive gas is selected from the group consisting of helium, argon, or nitrogen.

4. The method of claim 1, wherein the second flow rates are at least about 2 sccm higher than the first flow rates.

5. The method of claim 1, wherein the first flow rates range from about 0 sccm to about 1 sccm.

6. The method of claim 1, wherein the second flow rates range from about 1 sccm to about 10 sccm.

7. The method of claim 1, wherein the step of flowing heat transfer fluid comprises the step of maintaining a sufficient volume of heat transfer fluid at a sufficiently elevated pressure P in a heat transfer fluid reservoir proximate to the electrostatic member, to provide the second higher flow rates of heat transfer fluid to the conduits adjacent to the leaking portions of the outer periphery of the electrostatic member.

8. The method of claim 7, wherein the pressure P of the heat transfer fluid in the reservoir ranges of from about $P_L$ to about $P_H$, wherein (i) the higher pressure $P_H$ is selected so that flow of heat transfer fluid below the substrate does not dislodge the electrostatically held substrate, and (ii) the lower pressure $P_L$ is selected to provide the second higher flow rates of heat transfer fluid to the conduits adjacent to the leaking portion, substantially without reducing the first lower flow rates of heat transfer fluid to the conduits adjacent to the sealed portions.

9. The method of claim 8, wherein the pressure $P_L$ is at least about 1 Torr and the pressure $P_H$ is less than about 100 Torr.

10. The method of claim 1, further comprising the step of flowing heat transfer fluid through conduits in a central portion of the electrostatic member at a sufficient flow rate that the temperatures across the substrate are substantially equivalent.

11. The method of claim 1, wherein the step of flowing heat transfer fluid comprises flowing heat transfer fluid at sufficiently different first and second flow rates that the difference in temperatures across the substrate surface is less than about 1020 C.

12. An electrostatic chuck for holding a substrate in a process chamber, and maintaining the substrate at substantially uniform temperatures, the chuck comprising:

(a) an electrostatic member comprising an insulator covering an electrode, the insulator having a substantially planar and conformal contact surface that conforms to the substrate held on the chuck; and (b) a support supporting the insulator, the support comprising (i) a heat transfer fluid reservoir directly below the electrostatic member, and (ii) tapered conduits extending from the reservoir to the contact surface of the electrostatic member, the tapered conduits comprising first ends terminating at the contact surface and second ends terminating at the reservoir, the first ends having diameters smaller than diameters of the second ends.

13. The electrostatic chuck of claim 12 wherein the first ends of the conduits have diameters of less than about 1 mm, and the second ends of the conduits have diameters of at least about 1.5 mm.

14. The electrostatic chuck of claim 12 wherein the diameter of the first end of the tapered conduits is sized sufficiently smaller than the diameter of the second end of the tapered conduits to provide first lower flow rates of heat transfer fluid through the conduits adjacent to the sealed portions, and second higher flow rates of heat transfer fluid through the conduits adjacent to the leaking portions.

15. The electrostatic chuck of claim 14 wherein the second flow rates of heat transfer fluid are at least about 2 sccm higher than the first flow rates of heat transfer fluid.

16. The electrostatic chuck of claim 12 wherein, in use, application of a voltage to the electrode of the electrostatic member electrostatically holds the substrate on the conformal contact surface to define an outer periphery having leaking portions where heat transfer fluid leaks out, and sealed portions where heat transfer fluid substantially does not leak out; and wherein the diameter of the first end of the tapered conduits is sized sufficiently smaller than the diameter of the second end of the conduits to provide different flow rates of heat transfer fluid through the conduits at the leaking and sealed portions of the chuck.

17. The electrostatic chuck of claim 12 wherein the reservoir
(i) extends across all the conduits; and
(ii) is shaped and sized to hold, during use of the chuck, heat transfer fluid at a pressure from about $P_L$ to about $P_H$,
the higher pressure $P_H$ selected so that flow of heat transfer fluid through the conduits does not dislodge the electrostatically held substrate, and
the lower pressure $P_L$ selected to provide sufficiently high flow rates of heat transfer fluid to conduits adjacent to leaking portions of the chuck substantially without reducing the flow rates of heat transfer fluid to conduits adjacent to sealed portions of the chuck.

18. The electrostatic chuck of claim 17 wherein the pressure $P_L$ is at least about 1 Torr and the pressure $P_H$ is less than about 100 Torr.

19. The electrostatic chuck of claim 17 wherein the heat transfer fluid reservoir comprises a volume ranging from about 50 to about 150 cm$^3$.

20. The electrostatic chuck of claim 12 wherein the contact surface comprises a resilient material that, in use, conforms to the substrate under application of an electrostatic force generated by the electrostatic member.

21. The electrostatic chuck of claim 20 wherein the contact surface comprises polyimide.

22. The electrostatic chuck of claim 12 wherein the heat transfer fluid reservoir is formed within the electrostatic member.

23. The electrostatic chuck of claim 12 wherein the electrostatic member comprises grooves disposed between electrode segments, and wherein the first ends of the conduits terminate in the grooves.

24. The electrostatic chuck of claim 23 wherein the grooves comprise tips at the outer periphery of the contact surface, and the first ends of the conduits terminate at the groove tips.

25. The electrostatic chuck of claim 12 wherein the electrostatic member comprises a laminate including a first insulator layer supporting the electrode, and a second insulator layer over the electrode, the second layer merging with the first insulator layer around the circumference of the electrode to electrically insulate the electrode, and the second insulator layer comprising a contact surface for contacting the substrate that is substantially planar over the entire width of the electrostatic member.

* * * * *